United States Patent [19]

Fay

[11] Patent Number: 5,006,737
[45] Date of Patent: Apr. 9, 1991

[54] TRANSFORMERLESS SEMICONDUCTOR AC SWITCH HAVING INTERNAL BIASING MEANS

[75] Inventor: Gary V. Fay, Scottsdale, Ariz.

[73] Assignee: Motorola Inc., Schaumburg, Ill.

[21] Appl. No.: 341,881

[22] Filed: Apr. 24, 1989

[51] Int. Cl.[5] .................. H03K 17/687; H03K 17/60; H03K 3/42; H03K 3/01

[52] U.S. Cl. .................................. 307/571; 307/254; 307/311; 307/296.1; 307/296.5

[58] Field of Search ............... 307/571, 574, 577, 583, 307/584, 311, 254, 296.1, 296.5, 296.6, 296.8, 303.1, 303.2

[56] References Cited

U.S. PATENT DOCUMENTS

| | | | |
|---|---|---|---|
| 4,419,586 | 12/1983 | Phipps | 307/311 |
| 4,420,700 | 12/1983 | Fay et al. | 307/571 |
| 4,645,948 | 2/1987 | Morris et al. | 307/296.1 |
| 4,682,061 | 7/1987 | Donovan | 307/311 |
| 4,698,530 | 10/1987 | Thomson | 307/571 |
| 4,745,314 | 1/1988 | Iwasaki | 307/571 |
| 4,796,175 | 1/1989 | Nadd | 307/296.1 |
| 4,871,927 | 10/1989 | Dallavalle | 307/296.5 |

OTHER PUBLICATIONS

Owen, "Micro-Batteries", Solid State Batteries Proceedings of the NATO Advanced Study Institute, 1985, pp. 413-422.

Hooper et al., "All-Solid State Batteries", Journal of Power Sources, 11 (1984), pp. 33-41.

A. Hooper, "Solid State Batteries for Electronics and Microelectronics Applications", Elect. Ver. Dev (UK), vol. 6, No. 3, Jul. 1987, pp. 99-101.

Member of Siliconix Staff, "6.13.9 High Current Analog Switches", Siliconix Data Book, publication data unknown, pp. 6-182 to 6-183.

Primary Examiner—Stanley D. Miller
Assistant Examiner—Trong Phan
Attorney, Agent, or Firm—Robert M. Handy

[57] ABSTRACT

An improved semiconductor AC switch is described having internal bias generation for the power MOSFET switches and isolated control input. Dual power MOSFETS with substrate diodes are connected in series between source and load. DC gate bias for the MOSFETS is derived from an internal power supply containing energy storage which charges from the line, typically every half cycle. The gates of the power MOSFETS are tied to the internal bias generator through a voltage divider network containing a variable resistance controlled by an optical input signal. The internal energy storage may be a capacitor or solid state battery, preferably a monolithic thick or thin film battery. No transformers or external control bias generators are required and the resulting switch is particularly simple and compact.

20 Claims, 3 Drawing Sheets

TRANSFORMERLESS SEMICONDUCTOR AC SWITCH HAVING INTERNAL BIASING MEANS

FIELD OF THE INVENTION

This invention relates generally to means for switching or controlling AC power, and more particularly, improved solid state switching means employing internal bias generation, energy storage, and control input isolation to permit operation at high voltages.

BACKGROUND OF THE INVENTION

Historically, mechanical relays, vacuum tubes and gas discharge tubes have been utilized to control AC power where large voltage(e.g., >100 volts) are involved. More recently, semiconductor switches have been developed employing bipolar transistors, field effect transistors and thyristors. Such semiconductor based switches have a number of well known limitations which are well known in the art. Among these limitations is the difficulty of providing the proper DC bias to the control lead of the semiconductor device. In the prior art this has generally been accomplished by providing a separate power supply for bias generation or by using a transformer to provide DC isolation of the control circuitry from the main AC power leads or a combination thereof. These and other prior art methods are bulky and costly and often fail to provide adequate isolation between the control and power leads of the switch.

Accordingly, it is an object of the present invention to provide an improved means for switching AC power using semiconductor elements, and which does not require external bias generation or use of a transformer for isolating the control input.

It is a further object of the present invention to provide an improved means for switching AC power using semiconductor elements and internal, transformerless, bias generation which does not require a common ground reference between power and control signals.

As used herein the words "switch" or "semiconductor switch" are intended to refer to a device employing semiconductor elements for continuously variable and/or binary (on-off) control of electrical power; the word "monolithic" is intended to refer to a structure that is formed on a common substrate in an integrated fashion rather than being assembled from separate independent parts; and the words "MOSFET" or "MOSFETS" are intended to refer to insulated gate field effect devices having either N or P type channels and various geometries.

SUMMARY OF THE INVENTION

The foregoing and other objects and advantages are realized, in a preferred embodiment, through an electrical device comprising: first and second power MOSFETS, wherein first power terminals of the first and second MOSFETS are coupled together and a second power terminal of the first MOSFET is coupled to a first power input means and a second power terminal of the second MOSFET is coupled to a first power output means, and wherein the first and second MOSFETS have first and second gate electrodes coupled together; rectifying means having a first terminal coupled to the second power input means and a second terminal; energy storage means having a first terminal coupled to the second terminal of the rectifying means and a second terminal coupled to the first power terminals of the MOSFETS; and connection means extending from the first terminal of the energy storage means to the coupled together gate electrodes.

In a preferred embodiment for controlling AC power, the energy storage means includes a DC energy storage means charged from the AC power input and the connection means comprises a variable resistance means whose resistance is adjusted by an optical input signal. It is desirable that the energy storage means be internal to the device. It is also desirable that there be a predetermined resistance between the coupled together first power terminals and the coupled together gate electrodes. It is further desirable that the device of the present invention be formed in a monolithic fashion.

DETAILED DESCRIPTION OF THE FIGURES

The circuits illustrated in FIGS. 1-6 are shown using N-channel MOSFETS as the semiconductor switches and various diodes and other components arranged so as to provide conduction in directions appropriate thereto. However, this is merely for ease of understanding. Those of skill in the art will understand that P-channel devices could also be used and further understand how to arrange the direction of conduction of the various diodes and other components to provide an equivalently functioning circuit based on power MOSFETS of the opposite conductivity type.

Figure 1:
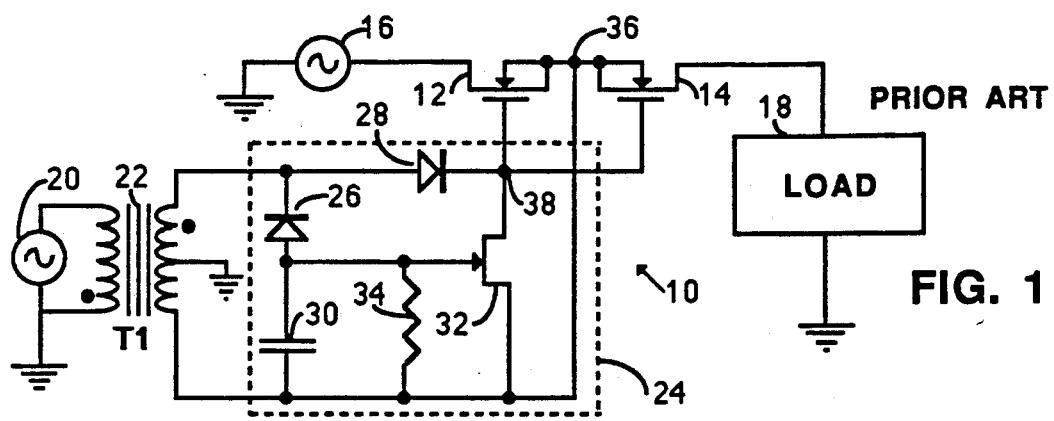
FIG. 1 shows a circuit schematic of an AC semiconductor switch according to the prior art.

FIG. 1 shows a circuit diagram 10 of an AC semiconductor switch of the prior art. N-channel MOSFETS 12,14 are connected in series between AC power source 16 and load 18. The control signal to turn MOSFETS 12, 14 on and off is provided by second AC source 20 through isolating transformer 22 and rectifying DC bias circuit 24. Bias circuit 24 is coupled to the gates of power MOSFETS 12, 14, and consists of rectifying diodes 26, 28, capacitor 30 and JFET 32 with resistor 34. Because of transformer 22, the bias provided between commonly connected sources 36 and commonly connected gates 38 of MOSFETS 12, 14 need not be referenced to the same ground as the AC power source 16.

In general, the prior art circuit of FIG. 1 cannot be provided in monolithic form since transformers suitable for use at low frequencies (e.g., <100 Megahertz and especially at standard 50–400 Hertz power frequencies) are not available in such form. Further, the prior art circuit of FIG. 1 requires second AC source 20 to generate the control voltage for biasing the power MOSFETS into or out of conduction.

FIGS. 2-6 show circuit diagrams of an improved AC semiconductor switch according to various embodiments of the present invention. In first embodiment 30 shown in FIG. 2, AC power source 32 is connected to input terminals 34, 35 and load 36 is connected to output terminals 38, 39 of switch 30. Power MOSFETS 40, 42 having common source connection point 44 are serially coupled between input 34 and output 38. Diodes 46, 48 bridge across MOSFETS 40, 42, respectively. Diodes 46, 48 may be substrate diodes associated with the drain regions of the power MOSFETS. In this respect it is desirable that the source regions be shorted to the portion of the substrate which forms the substrate-drain diode. Gates 50, 52 of MOSFETS 40, 42 are tied together at common gate connection point 56. Resistor 58 is desirably provided between common gate connection point 56 and common source connection point 44.

In order for AC switch 30 to conduct when input terminal 34 is instantaneously positive, sufficient DC bias must be applied to gate 50 to turn-on MOSFET 40. Current then flows through MOSFET 40 and diode 48 to load 36. When input terminal 34 is instantaneously negative, then the functions of the MOSFETS and diodes are reversed and conduction is via MOSFET 42 and diode 46. In this respect the functioning of the present circuit is the same as the prior art circuit of FIG. 1.

Figure 2:
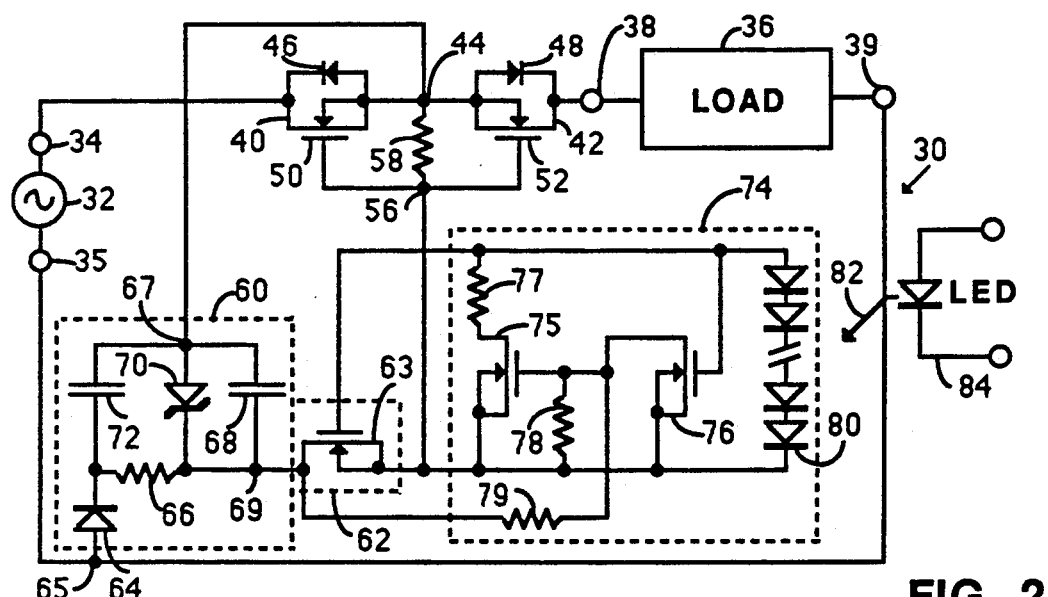
FIGS. 2-6 show circuit diagrams of an AC semiconductor switch according to various embodiments of the present invention.

However, unlike the prior art circuit of FIG. 1, the present invention shown in FIG. 2 does not require a separate oscillator and transformer for generating the control bias voltage to be applied to the gates of the power MOSFETS. As shown in the embodiment of FIG. 2, the present invention employs a bias generator 60, 62 which derives its power from the same AC input 34, 35 which provides (through switch 30) power to load 36.

Energy storage module 60 is charged from the AC line at least during a portion of the AC waveform, typically each half-cycle. In a first embodiment, energy storage module 60 comprises rectifying diode 64, series current limiting resistor 66, and charge storage capacitor 68. Zener diode and filter capacitor 72 are conveniently used to regulate the voltage across capacitor 68. Terminal 65 of energy storage module 60 is connected to input terminal 35 and terminal 67 is connected to common source connection point 44. These connections provide the AC pathway of energy storage module 60.

Variable resistance 62, for example, a MOSFET is provided between DC output 69 of energy storage module 60 and common gate connection point 56. Resistances 62 and 58 provide a voltage divider. When variable resistance 62 is high (e.g., MOSFET 63 turned off), then resistor 58 pulls common gate connection point 56 to the potential of common source connection point 44 and MOSFETS 40, 42 are turned off. When variable resistance 62 is low (e.g., MOSFET 63 turned on) then the voltage between common source connection point 44 and common gate connection point 56 will rise to the voltage determined by the ratio of resistance 58 and resistance 62 and the voltage of DC output 69 of energy storage module 60.

Control module 74 comprising, in this embodiment, transistors 75, 76, resistors 77-79 and photovoltaic diode stack 80, provides the bias necessary to turn variable resistance 62 on or off in response to externally supplied optical signal 82 derived, for example, from LED 84. Diode stack 80 must have enough series connected diodes therein to generate a voltage above the threshold of MOSFET 63 to fully turn it on so that, in turn, most of the voltage provided by module 60 appears across the gates of MOSFETS 40, 42 to turn them on. When light 82 strikes diode string 80, a voltage appears at the gate of transistor 76 turning it on, which then pulls the gate of transistor 75 below its threshold voltage, tuning off transistor 75 so that it cannot short out the voltage from diode stack 80. Resistor 77 and transistor 75 insure that when there is no light falling on diode stack 80, the gate of transistor 63 does not charge up and inadvertently turn on device 63 and, in turn, devices 40, 42.

It has been determined that an AC semiconductor switch capable of switching about 4 amps at 120 volts can be implemented according to FIG. 2 where, conveniently, resistor 58 has about 3k ohms, resistors 66 and 79 have about 30k ohms, resistor 78 has about 50k ohms and resistor 77 has about 75k ohms. Resistors of such values occupying reasonable areas are readily formed from lightly doped or undoped polysilicon, but other resistor materials well known in the art may also be used. While these resistor values are convenient, other values are useful, so long as they provide the resistor ratios appropriate to yield the voltage divider action already discussed. A ratio of about 10:1 in the off-state and about 1:1 in the on-state are convenient for variable resistance means 62 and fixed resistance 58. Higher currents and/or voltages can be switched by using larger transistors 40, 42 and/or transistors with greater voltage stand-off capability.

For 50-60 cps operation, for example, capacitors 68, 72 are conveniently about 1 microfarad although larger or smaller capacitors can also be used. Capacitor 72 sees the peak line voltage but capacitor 68 is protected by resistor 66 and Zener diode 70. Capacitor 72 supplies charge through resistor 66 when the line voltage is lower than peak or on the opposite half cycle. The size of the energy storage capacitors is determined by the time constant of the power MOSFET gate capacitance and resistor 58. By increasing the value of resistor 58 while maintaining an adequate resistance ratio of variable resistance means 62 and resistance 58, the amount of energy storage capacitance decreases. Sufficient energy must be stored in the combination of the gate capacitance and the energy storage capacitance so that the gates of power MOSFETS 40, 42 will remain on during the half-cycle when energy is not being supplied to energy storage means 60 and gate connection point 56 from the line.

Zener diode 70 conveniently has a breakdown voltage of about 8 volts. Photovoltaic diode string 80 should deliver about 6 volts and 50 microamps when illuminated.

Voltage regulator diodes and photovoltaic diodes are formed by providing adjacent semiconductor regions of predetermined doping using means well known in the art. Common semiconductor device fabrication techniques may be employed to form capacitors 68, 72 in energy storage module 60. It is desirable to use higher dielectric constant materials, such as for example silicon nitride, as the capacitor dielectric in order to reduce the occupied area of the capacitors.

Figure 3:
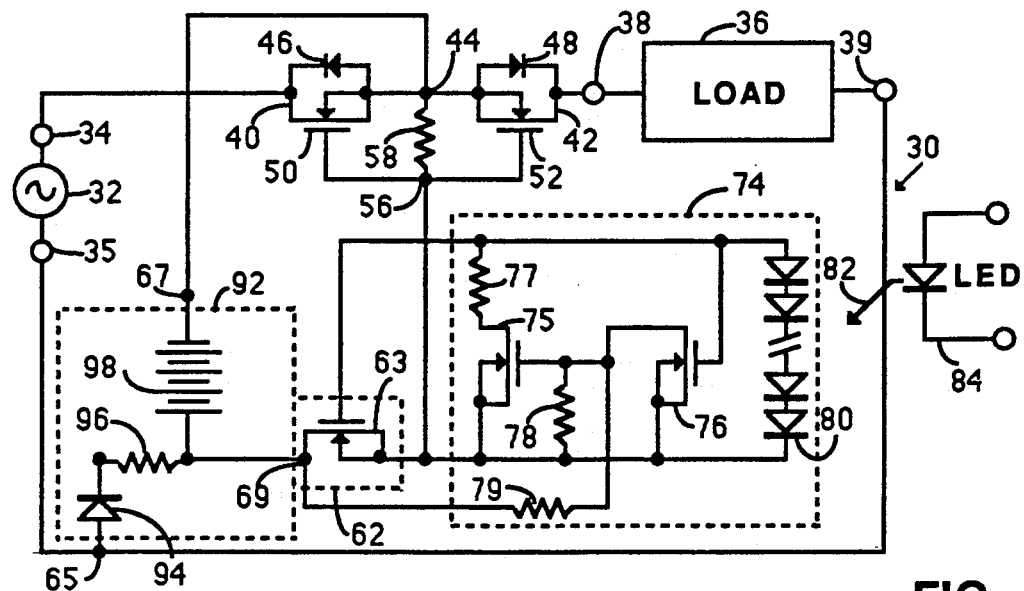

FIG. 3 shows an improved AC semiconductor switch according to a further embodiment of the present invention in which energy storage module 60 of FIG. 2 has been replaced by energy storage module 92 comprising rectifying diode 94, series resistance 96 and battery 98. Output points 65, 67 and 69 of module 92 have the same connections to other circuit points as with energy storage module 60 of FIG. 2.

While battery 98 can be a conventional storage cell, it is desirable that battery 98 be monolithic, that is, be formed on the same substrate as the remainder of switch 30. Batteries which employ solid electrolytes are well known in the art. Examples are described by A, Hooper in "SOLID STATE BATTERIES FOR ELECTRONICS AND MICROELECTRONICS APPLICATIONS", Electric Vehicle Developments (UK), Vol. 6, No. 3, July 1987, pages 99-101, by A. Hooper and B. Tofield in "ALL SOLID STATE BATTERIES", Journal of Power Sources, Vol. 11, Jan-Feb 1984, pages 33-41, and by J. Owen in "MICRO-BATTERIES", Solid State Batteries, Proceedings of the NATO Advanced Study Institute, 1985, Pages 413-422. Solid state batteries that can be formed as thick or thin films or a combination thereof are described therein. Thus, by forming, for example, a thin film solid state battery on the same substrate as used for the transistors, resistors and diodes, using means known in the art, a monolithic switch with integral energy storage capability is provided.

As those of skill in the art will appreciate, because MOSFETS are used for the power switching devices, the amount of energy that must be stored either in capacitor 68 of FIG. or battery 98 of FIG. 3 is small. Further, the energy need not be stored for a lengthy period of time since the stored energy is frequently refreshed, typically but not essentially, every half-cycle. This energy storage refresh occurs as long as the switch is connected to the line no matter whether the switch is turned 'off' or 'on'.

Figure 4:
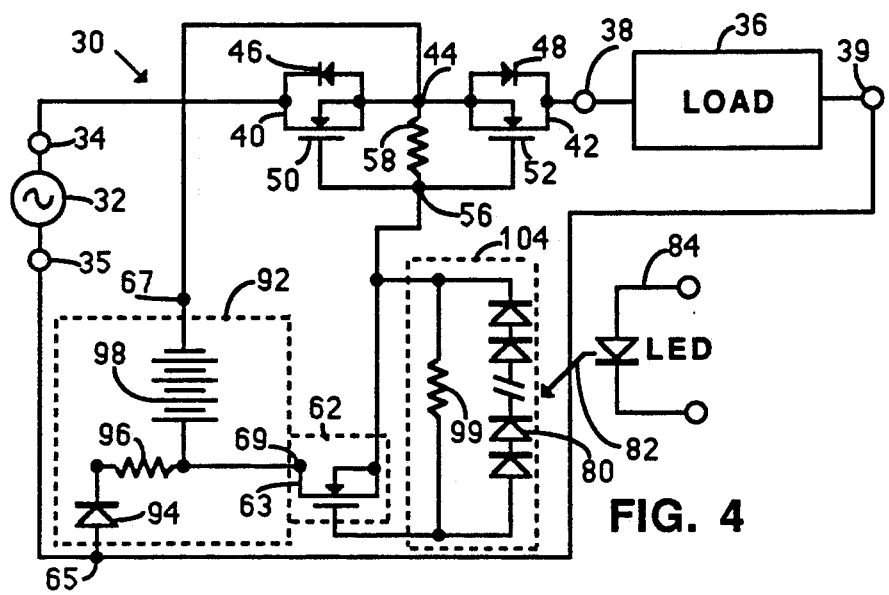

FIG. 4 shows a further embodiment of switch 30 in which control modules 74 of FIGS. 2-3 has been simplified and replaced by control module 104. Control module 104 comprises diode string 80 and resistor 99. Diode string 80 is, as before, energized by light 82. Resistor 99 allows the charge developed on diode string 80 and stored, for example, on the gate of MOSFET 63 to dissipate when light 82 is removed. This allows MOSFET 63 to return to its high impedance state, turning off power MOSFETS 40, 42. The arrangement of module 104 in FIG. 4 has the advantage of requiring fewer components than the arrangement of module 74 in FIGS. 2-3, but the disadvantage of requiring more drive from diode stack 80 (e.g., larger diodes or more light) to provide current through resistor 99 and keep the gate of transistor 63 well above threshold so that its on-resistance stays low.. Those of skill in the art will understand that the arrangement of FIG. 4 may utilize energy storage means 92, as shown, or energy storage means 60 of FIG. 2.

Figure 5:
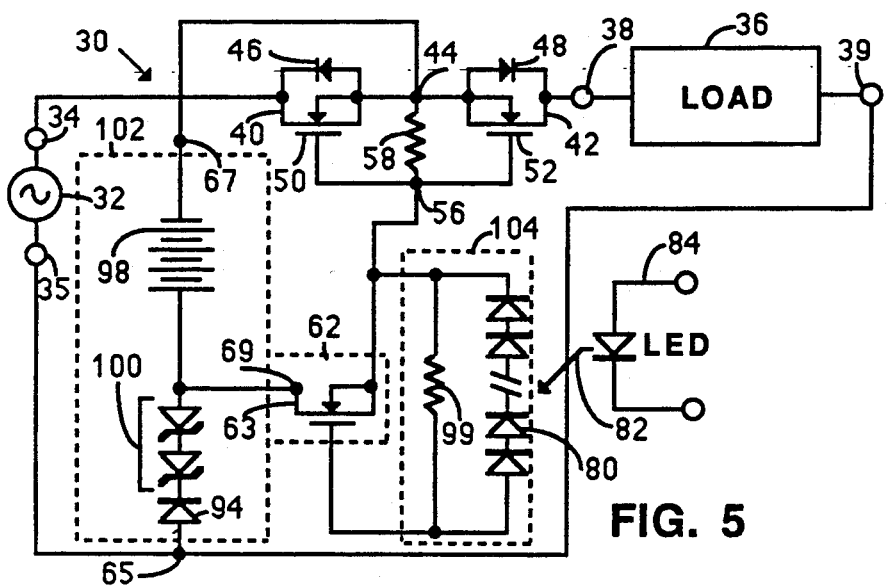

FIG. 5 shows a further embodiment of the present invention wherein energy storage means 60 of FIG. 2 or 92 of FIG. 4 is replaced by energy storage means 102 comprising rectifier diode 94, voltage regulator diodes 100 and battery 98. Voltage regulator diodes 100 provide a predetermined maximum voltage drop. One or more voltage regulator diodes may be used depending upon the magnitude of voltage desired, which varies with the desired line operating voltage, as those of skill in the art will appreciate based on the description herein. Output connections 65, 67, and 69 of means 102 are connected as before and the circuit of FIG. 5 functions in the manner previously described, taking into account the internal differences in energy storage means 102.

Figure 6:
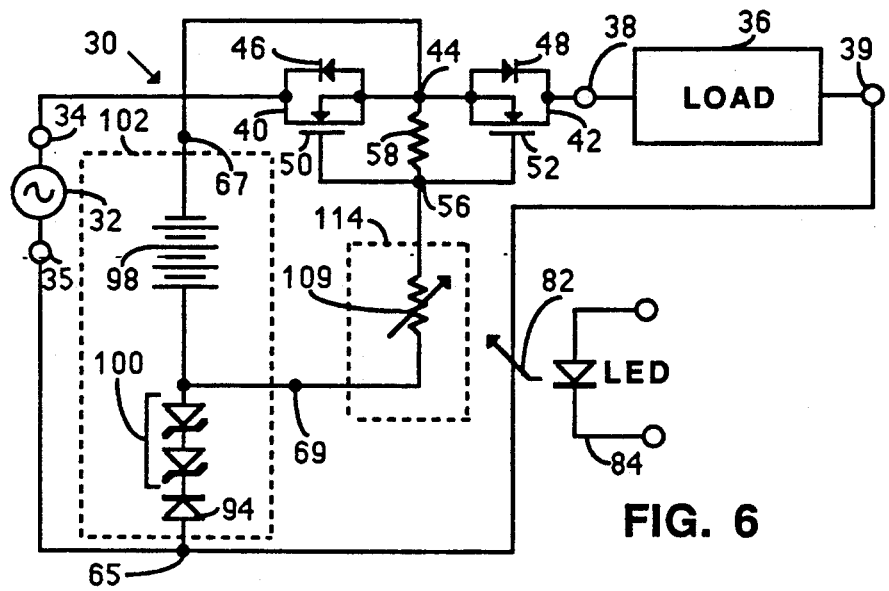

FIG. 6 shows a schematic of a further embodiment of the invention which is particularly simple and which has the further advantage of ease of construction. Variable resistance means 62 and control means 74 or 104 have been combined and replaced by photosensitive variable resistance means 114. Those of skill in the art will understand that the circuit of FIG. 6 can utilize energy storage means 102, as shown, or either of previously described energy storage means 60 or 92, or an equivalent. Light 82 shining on variable resistance means 114 causes the value of resistor 109 to drop from a high (dark) value to a lower (illuminated) value. The DC voltage provided by energy storage means 102 (or 60 or 92) at connection 69 divides across the voltage divider formed by resistors 109 and 58. By properly selecting the values of resistor 58 in comparison to the dark and light resistance values of photosensitive variable resistor 109, the source-gate voltage at common gate connection point 56 is made to swing from below threshold to significantly above threshold (but less than breakdown) when photosensitive resistor 109 is illuminated. Those of skill in the art will understand how to choose the various resistance values based on the description given herein. The maximum source-gate voltage appearing at common gate connection point 56 is limited by the output voltage provided by energy storage means 60, 92, or 102. This is less than the gate breakdown voltage of power MOSFETS 40, 42, regulated either by Zener 70 for energy storage means 60 or by the voltage of battery 98. In general, battery 98 acts both as an energy storage means and a voltage limiter. If additional voltage limiting action is desired in the arrangements of FIGS. 4-6, then an additional voltage regulator may be placed across battery 98.

Photosensitive variable resistor 109 is conveniently provided by means of a region of semiconductor material either in the semiconductor substrate used for forming the power MOSFETS and/or the other devices, or by means of a layer of semiconductor material, e.g., polycrystalline semiconductor, deposited on a dielectric layer on the substrate surface. Polysilicon is a particularly convenient material, since its resistivity can be adjusted across broad ranges by doping, it is known to be highly photosensitive, and its fabrication as a photosensitive variable resistor may be accomplished by the same techniques, well known in the art, used for forming power MOSFET 40, 42 and other parts of switch 30. Photo-resistor 109 can also be a photosensitive FET.

Figure 7:
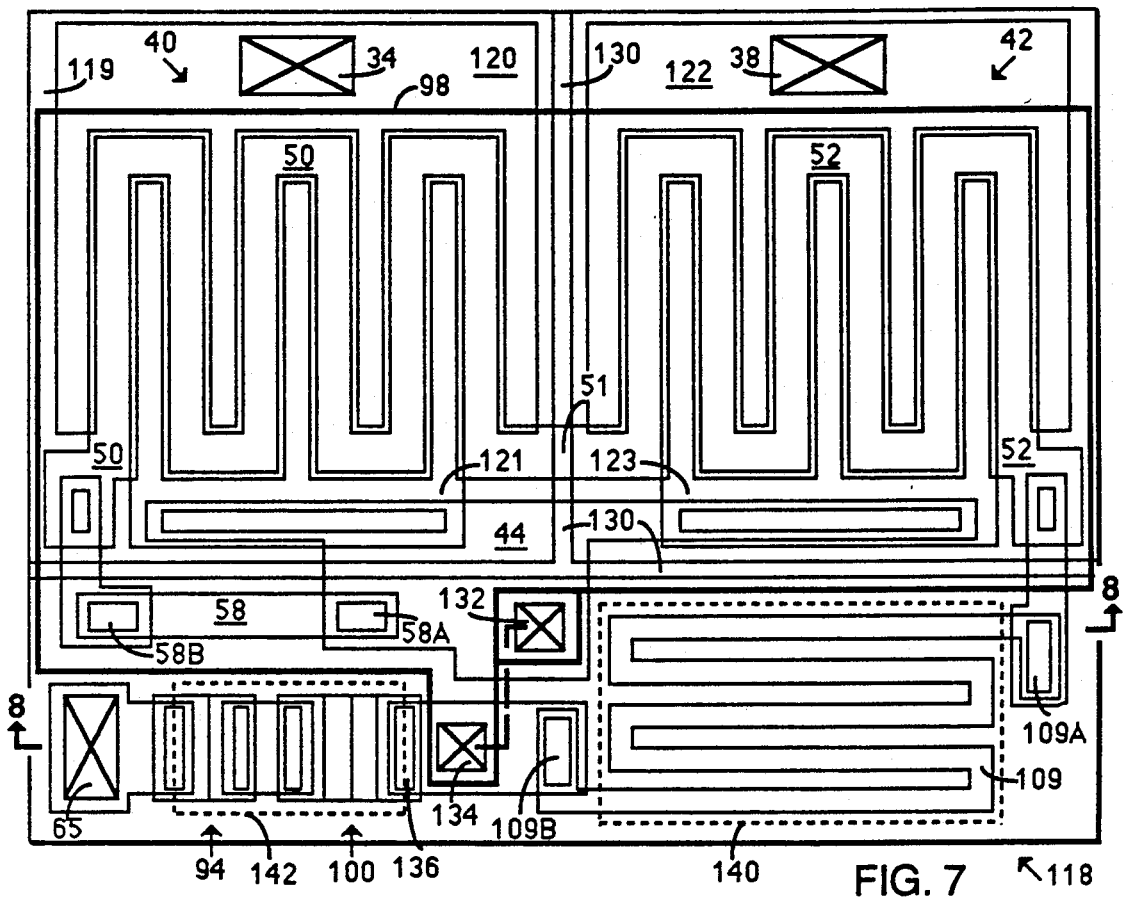
FIG. 7 shows a simplified plan view of a monolithic implementation of the circuit of FIG. 6.
Figure 8:
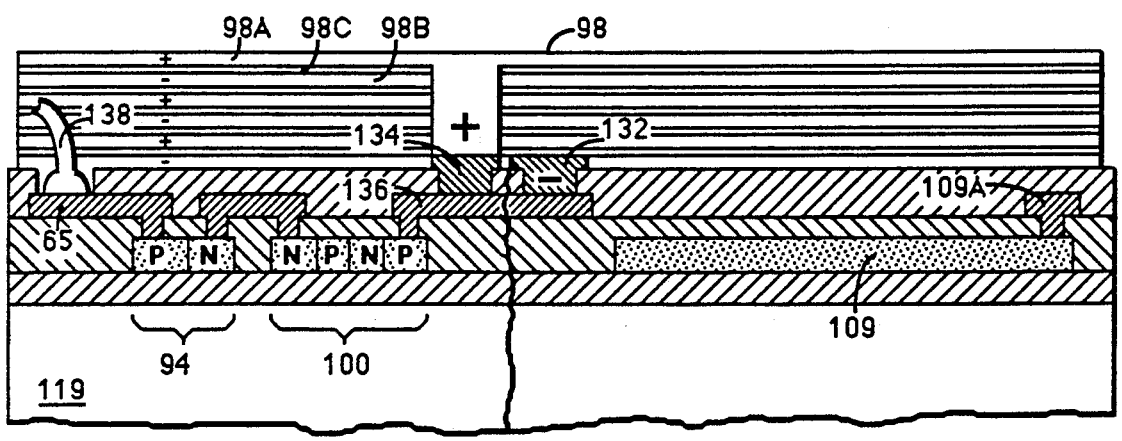
FIG. 8 shows a simplified partial cut-away and front view of the device of FIG. 7.

FIG. 7 is a plan view in highly simplified form of monolithic AC switch 118 of the present invention showing how the circuits illustrated in FIGS. 2-6, and especially the circuit of FIG. 6, may be realized. As an aid to understanding and as is conventional in the art, the various overlapping regions and layers of the device of FIG. 7 have been shown as if transparent so that their relative position may be easily determined. Where possible, the various regions in FIGS. 7-8 have been identified with the same reference numbers used in FIG. 6 so that the correspondence between the circuit diagram of FIG. 6 and the physical realization of FIGS. 7-8 may be readily understood. FIG. 8 is a simplified partial cut-away and front view of the device of FIG. 7. In the cut-away portions of FIG. 8, the semiconductor substrate is shown clear, regions that are conveniently fabricated of polycrystalline semiconductor, e.g., polysilicon, are shown stippled, dielectric regions have widely spaced hatching, and metal or other conductor regions have narrowly spaced hatching.

AC switch 118 comprises power MOSFETS 40, 42. While MOSFETS 40, 42 are illustrates as conventional lateral MOSFETS formed in semiconductor substrate 119, those of skill in the art will appreciate that DMOS or TMOS types of devices with top contacts could also be used. MOSFET 40 has drain 120, source 121 and gate 50. Input connection 34 is coupled to drain 120.

MOSFET 42 has drain 122, source 123 and gate 52. Output connection 38 is coupled to drain 122. Isolation region 130 separates drains 120, 122. Sources 121, 123 are coupled by conductive connection 44 which also attaches to end 58A of resistor 58 and to terminal 132 of battery 98.

In the embodiment illustrated in FIGS. 7-8, battery 98 lies above power MOSFETS 40, 42 and is indicated in FIG. 7 by the heavy outline. For convenience in viewing the underlying components, battery 98 is taken as transparent in FIG. 7. Battery 98 desirably comprises a stack of positive and negative conductive plates or layers 98A, 98B separated by solid electrolyte 98C. As those of skill in the art will understand based on the description herein, the number of series connected cells (i.e., − layers) will depend upon the individual cell voltage and the threshold voltage of devices 40, 42. Battery 98 is formed by means well known in the art and is desirably integral with switch 118. Before forming battery 98 it is desirable to provide a dielectric planarization layer over devices 40, 42 to give a substantially smooth surface for receiving battery 98 and to act as a passivation layer to protects the underlying components from the materials used to form battery 98. Silicon nitride, silicon dioxide, doped glasses and mixtures thereof, or organic polymers such as for examples polyimides, are examples of suitable planarizing and passivating materials. Such materials are formed by means well known in the art.

Gates 50, 52 are commonly connected, for example at 51 across isolation region 130, and coupled to end 58B of resistor 58 and to end 109A of photo-resistor 109. End 109B of photoresistor 109 is coupled to terminal 134 of battery 98 and to connection point 136 of Zener diodes 100 which are in turn connected to rectifying diode 94. A suitable arrangement of P and N regions formed in polysilicon is illustrated in the cut-away view of FIG. 8. Diode 94 is coupled to terminal 65 where wire bond 138 for example, see FIG. 8, is used to make external connection to the reference terminal of switch 118 For simplicity, wire bond 138 is omitted from FIG. 7.

Dashed lines 140, 142 which surround respectively optically sensitive device 109 and charging circuit 94, 100 are intended to indicate that the structures therein in FIGS. 7-8 may be replaced by other embodiments of the photosensitive and charging means (including resistance means 62), as for example those shown in FIGS. 2-5. The battery likewise may be replaced by the energy storage means illustrated in FIG. 2.

Having thus described the invention it will be apparent to those of skill in the art that a particularly compact and improved AC semiconductor switch is provided. A desirable result of the invented arrangement is that isolation which will withstand several kilovolts potential difference between control and power circuits is provided and no common ground or reference is need between control and power circuits. They are optically isolated. A further advantage of the present invention is that no transformer is required in the control circuit and no separate external bias generator need be employed. Hence, the invented circuit, structure and method is particularly simple, economical and suited to monolithic implementation.

Those of skill in the art will also appreciate that variations may be made on the present invention without departing from the scope thereof. For example and not intending any limitation, while the embodiments have been described as using various combinations of MOSFETS and P and N regions, those of skill in the art will appreciate that P and N may be reversed and that other types of devices may also be used. Further, while the implementation has been described as being desirably made on a semiconductor substrate, other substrates suitable for device formation may also be used. Accordingly, it is intended to include such variations in the claims that follow.

I claim:

1. A transformerless AC semiconductor switch for coupling AC power to an AC load, comprising:
    first and second power input means for receiving power from an AC source;
    first and second power output means for coupling AC power to a load;
    first and second series connected MOSFETS having connected together first power terminals and second power terminals coupled between the first power input means and the first power output means, wherein the MOSFETS have connected together gate electrodes; and
    internal voltage bias means coupled between the connected together first power terminals and the connected together gate electrodes of the MOSFETS for providing a gate voltage larger than the threshold voltage of at least one of the power MOSFETS, wherein the internal voltage bias means generates the bias from the first and second power input means without use of a transformer.

2. The switch of claim 1 further comprising first and second diode means between the power terminals of the first and second MOSFETS, respectively, and arranged in serial opposed fashion between the power input and output means.

3. The switch of claim 1 wherein the internal voltage bias means comprises a first rectifying means having a first terminal coupled to the second power input means and a second terminal coupled to the connected together first power terminals through at least one capacitor and coupled to the connected together gate electrodes through a current limiting means.

4. The switch of claim 3 further comprising a resistor and a voltage reference means, wherein the resistor has a first terminal connected to a first terminal of the at least one capacitor and to the second terminal of the rectifying means and a second terminal connected to a first terminal of the voltage reference means and wherein the voltage reference means has a second terminal coupled to a second terminal of the at least one capacitor.

5. The switch of claim 4 further comprising a controllable variable resistance means having a first power terminal coupled to the second terminal of the resistor and a second power terminal coupled to the connected together gate electrodes.

6. The switch of claim 5 further comprising energy storage means coupled across the voltage reference means.

7. The switch of claim 5 wherein the resistance of the controllable variable resistance means varies in response to an optical input signal.

8. The switch of claim 7 wherein the controllable variable resistance means comprises a photovoltaic device.

9. A transformerless AC semiconductor switch for coupling AC power to an AC load, and having internal biasing means, comprising:

first and second power input means for accepting AC power;

first power output means for coupling AC power to a load;

first and second series opposed connected MOSFETS having coupled together first power terminals and second power terminals coupled, respectively, to the first power input and first power output means, wherein the MOSFETS have coupled together gate electrodes; and internal voltage bias means coupled between the coupled together first power terminals and the coupled together gate electrodes of the MOSFETS for providing a gate voltage larger than the threshold voltage of at least one of the power MOSFETS, wherein the voltage bias means comprises an integral energy storage means coupled to the first and second power input means for receiving energy therefrom during at least some half cycles of the AC power.

10. The switch of claim 9 wherein the integral energy storage means comprises a capacitor.

11. The switch of claim 9 wherein the integral energy storage means comprises a diode whose input is coupled to the second power input means, a resistor and a capacitor having first terminals coupled to the diode output, and a voltage reference means coupled across second terminals of the resistor and capacitor.

12. The switch of claim 11 further comprising means for coupling the juncture of the capacitor and voltage reference means to the coupled together first power terminals, and means for coupling the juncture of the resistor and the voltage reference means to the coupled together gate electrodes.

13. The switch of claim 12 further comprising resistance means coupled between the coupled together first power terminals and the coupled together gate electrodes.

14. The switch of claim 9 wherein the integral energy storage means comprises a solid state battery.

15. The switch of claim 14 wherein the integral energy storage means is monolithic with the switch.

16. The switch of claim 14 wherein the energy storage means comprises a diode coupled between the second power input means and a first terminal of the battery and wherein a second terminal of the battery is coupled to the coupled together first power terminals.

17. A transformerless AC semiconductor switch for coupling AC power to an AC load, and having internal energy storage means, comprising:

first and second power input means for accepting AC power;

first and second power output means for coupling AC power to a load;

first and second MOSFETS having coupled together first power terminals and having a second power terminal of the first MOSFET coupled to the first power input means and having a second power terminal of the second MOSFET coupled to the first power output means and having coupled together gate electrodes;

rectifying means having a first terminal coupled to the second power input means and a second terminal;

energy storage means having a first terminal coupled to the second terminal of the rectifying means and a second terminal coupled to the coupled together first power terminals of the MOSFETS; and connection means extending from the first terminal of the energy storage means to the coupled together gate electrodes.

18. The switch of claim 17 wherein the connection means comprises a variable resistance means whose resistance is adjusted by an optical input signal.

19. The switch of claim 18 further comprising resistance means extending between the coupled together first power terminals and the coupled together gate electrodes.

20. The switch of claim 17 wherein the rectifying means comprises a rectifying diode in series with a least one opposed voltage reference diode.

* * * * *